United States Patent [19]

Zinck et al.

[11] Patent Number: 5,382,542
[45] Date of Patent: Jan. 17, 1995

[54] METHOD OF GROWTH OF II-VI MATERIALS ON SILICON USING AS PASSIVATION

[75] Inventors: Jennifer J. Zinck, Calabasas; Damodaran Rajavel, Los Angeles; John E. Jensen, Newbury Park, all of Calif.

[73] Assignee: Hughes Aircraft Company, Los Angeles, Calif.

[21] Appl. No.: 98,017

[22] Filed: Jul. 26, 1993

[51] Int. Cl.$^6$ .................................................. H01L 21/20
[52] U.S. Cl. .................................... 437/126; 437/105; 437/107; 437/129; 437/133; 437/132
[58] Field of Search ............... 437/105, 107, 126, 129, 437/133, 132

[56] References Cited

U.S. PATENT DOCUMENTS

| | | | |
|---|---|---|---|
| 4,804,638 | 2/1989 | Hoke et al. | 437/81 |
| 4,886,683 | 12/1989 | Hoke et al. | 437/245 |
| 4,904,616 | 2/1990 | Bohling et al. | 437/133 |

FOREIGN PATENT DOCUMENTS 0294431  4/1990  Japan .................................. 156/612

OTHER PUBLICATIONS

Bringans et al. "Effect of interface chemistry on the growth of ZnSe on the Si(100) surface" in Physical Review B, vol. 45(23), Jun. 1992, pp. 13,400–13,406.

R. D. Bringans et al, Materials Research Society Symposium Proceedings, vol. 242, pp. 191–202 (1992).
M. L. Colaianni et al, Chemical Physics Letters, vol. 191, pp. 561–568 (17 Apr. 1992).
P. Kaul et al, Journal of Crystal Growth, vol. 123, pp. 411–422 (1992).
B. S. Meyerson et al, Applied Physics Letters, vol. 57, pp. 1034–1036 (1990).

*Primary Examiner*—R. Bruce Breneman
*Assistant Examiner*—Ramamohan Rao Paladugu
*Attorney, Agent, or Firm*—V. D. Duraiswamy; W. K. Denson-Low

[57] ABSTRACT

A metalorganic arsenic source comprising $R_{3-m}AsH_m$, where R is an organic radical selected from the group consisting of $C_nH_{2n+1}$ and $C_nH_{2n-1}$, where n ranges from 1 to 6, and where m is 1 or 2, such as tert-butylarsine (t-BuAsH$_2$), is useful in terminating a silicon surface with arsenic without carbon contamination, thereby permitting subsequent growth of high quality ZnSe. Use of this metalorganic arsenic source allows the full potential of the metalorganic molecular beam epitaxy (MOMBE) deposition technique, which has demonstrated superior flux control than that achieved by MBE, to be realized in the heteroepitaxy of HgCdTe on silicon substrates. Other metalorganic deposition procedures, such as MOVPE, may also be employed in the practice of the invention.

18 Claims, 3 Drawing Sheets

METHOD OF GROWTH OF II-VI MATERIALS ON SILICON USING AS PASSIVATION

BACKGROUND OF THE INVENTION

1. Field of the Invention

The present invention relates to the deposition of II-VI semiconductor films, and, more particularly, to the deposition of ternary chalcogenide semiconductor films, such as HgCdTe and HgZnTe, onto silicon substrates.

2. Description of Related Art

Ternary II-VI semiconductor films find use in many infra-red (IR) applications, such as in IR focal plane arrays (FPAs). Examples of such ternary II-VI semiconductor compounds include HgCdTe and HgZnTe, which are also known as chalcogenides.

The current size of HgCdTe focal plane arrays which are fabricated from homoepitaxial material is limited to 64×64 pixels because of delamination problems with the silicon readout to which the FPA is bonded by indium bump technology. The delamination problem is a consequence of the large thermal expansion mismatch between silicon and the CdZnTe substrate on which the active HgCdTe layers are grown.

Direct growth of HgCdTe on silicon not only accommodates this mismatch by forcing the FPA to expand and contract with the silicon substrate but allows HgCdTe growth on large area high quality substrates which are not available for homoepitaxy. Direct growth of HgCdTe on silicon is difficult, however, due to the large lattice mismatch (approximately 20%) and the polar versus nonpolar nature of HgCdTe versus silicon.

Buffer layers of ZnSe (4% lattice mismatch with silicon) and ZnTe (8% lattice mismatch with silicon) can De grown to step grade the transition to HgCdTe, but direct growth of these materials on silicon also yields poor quality or polycrystalline films.

Recently, it has been reported that high quality layers of ZnSe can be grown on silicon by molecular beam epitaxy (MBE) if the silicon substrate is terminated by a layer of arsenic atoms; see, e.g., R.D. Bringans et al, *Materials Research Society Symposium Proceedings*, Vol. 242, pp. 191-202 (1992). It is hypothesized that the function of arsenic is to passivate the silicon surface by fully coordinating the surface layer as well as providing an initial polarization of the surface for subsequent II-VI growth.

The first demonstration of the MBE growth of ZnTe on As-terminated silicon was recently the subject of patent application Serial No. 08/043,644, filed Apr. 6, 1993, and assigned to the same assignee as the present application.

Successful growth of ZnSe on Si terminated with a monolayer of As (henceforth referred to as ZnSe//As:Si) achieved by MBE, however, does not mean that the same approach will be successful in a metalorganic MBE (MOMBE) environment. Due to the large background pressure of organic radicals in the MOMBE environment generated by the thermal pre-cracking of the metalorganic sources, it has been believed that MOMBE growth on silicon would not be possible. It is well-documented in the surface science literature that hydrocarbon radicals, in particular methyl radicals, irreversibly adsorb on silicon surfaces and decompose to form carbides on the surface when heated; see, e.g., M.L. Colaianni et al, *Chemical Physics Letters*, Vol. 191, pp. 561-568 (Apr. 17, 1992). Studies have also shown that organoarsenic sources will strongly interact with surface oxides to leave carbonaceous contamination on the growth surface; see, e.g., P. Kaul et al, *Journal of Crystal Growth*, Vol. 123, pp. 411-422 (1992).

Simply adding a solid arsenic source to the MOMBE growth chamber is not the best solution, as the compatibility of solid sources in a metalorganic environment is not established. Accordingly, a method is needed for the formation of a monolayer of arsenic on silicon substrates using MOMBE.

Similar considerations also apply for the deposition of arsenic on silicon substrates using other metalorganic deposition procedures. An example of such other deposition procedure is MOVPE (metalorganic vapor phase epitaxy), also known as MOCVD (metalorganic chemical vapor deposition), which is carried out under vacuum conditions not as high as those employed in MOMBE. For example, the base pressure after bakeout for MOMBE will be ultrahigh vacuum ($10^{-10}$ to $10^{-11}$ Torr) MOVPE chambers are not baked and have base pressures more typically on the order of $10^{-4}$ to $10^{-7}$ Torr, depending on how they are pumped.

Thus, a need remains for the epitaxial growth of good quality binary and ternary II-VI semiconductor films on a silicon substrate.

SUMMARY OF THE INVENTION

In accordance with the invention, a metalorganic arsenic source is provided that can terminate a silicon surface with a monolayer of arsenic without carbon contamination and permit subsequent growth of high quality ZnSe thereon. Use of such a metalorganic arsenic source allows the full potential of the MOMBE technique, which has demonstrated superior flux control than that achieved by MBE, to be realized in the heteroepitaxy of HgCdTe on silicon substrates. Further, the metalorganic arsenic source can be used in other metalorganic deposition procedures, such as MOVPE.

The method of the invention employs as the metalorganic arsenic source a compound of the formula $R_{3-m}AsH_m$, where R is an organic radical selected from the group consisting of $C_nH_{2n+1}$ and $C_nH_{2n-1}$, where n ranges from 1 to 6, and where m is 1 or 2.

The arsenic metalorganic compound is used in vacuum deposition processes in which the ratio of reagent (metalorganic compound) pressure to background pressure is advantageously at least about 100:1.

The method of the invention comprises exposing a silicon substrate having an appropriately cleaned and hydrogen-terminated surface to the arsenic metalorganic source and monitoring the nature of the surface by reflection high-energy electron diffraction (RHEED) analysis. Specifically, during the deposition, the RHEED intensity initially increases. Once the RHEED intensity stops increasing, or saturates, the silicon surface is passivated with arsenic and the silicon wafer can then be further processed for growth of the II-VI layer on the arsenic-terminated surface.

The arsenic metalorganic source employed in the method of the invention provides a monolayer of arsenic on the silicon surface without carbon contamination of the surface.

DESCRIPTION OF THE PREFERRED EMBODIMENTS

Figure 1:
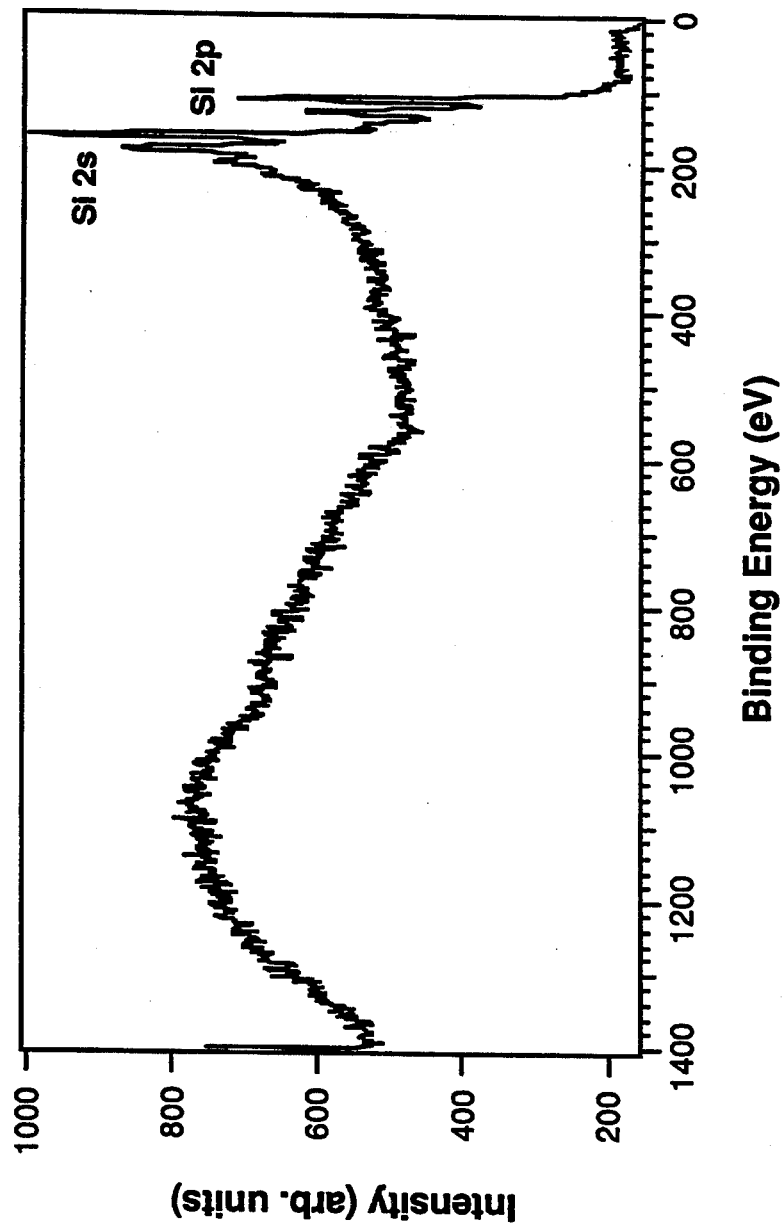
FIG. 1 on coordinates of intensity (in arbitrary units) and binding energy (in eV), is an X-ray photoelectron spectroscopy (XPS) spectrum (Al Kα excitation, Fixed Retard Ratio (FRR) 5 analyzer mode, 15 KV, 20 ma) of a silicon substrate, prepared by a dip in 4.5% HF, prior to exposure to t-butylarsine.

The present invention details a method whereby high quality layers of II–VI materials can be grown by MOMBE directly on silicon substrates. This has been achieved by using an arsenic metalorganic compound of the formula $R_{3-m}AsH_m$, where R is an organic radical selected from the group consisting of $C_nH_{2n+1}$ and $C_nH_{2n-1}$, where n ranges from 1 to 6, and where m is 1 or 2. Preferably, n is at least 2.

Examples of metalorganic arsenic compounds useful the practice of the invention broadly include $C_nH_{2n+1}AsH_2$, $C_nH_{2n-1}AsH_2$, $(C_nH_{2n+1})_2AsH$, and $(C_nH_{2n-1})_2AsH$. More specific examples include tertiary-butyl arsine, isopropyl arsine, ethyl arsine, neopentyl arsine, cyclohexyl arsine, allyl arsine, and vinyl arsine.

Such arsenic metalorganic compounds as defined above may be used to terminate the silicon substrate with a layer of arsenic atoms prior to the initiation of II–VI growth. In particular, the use of tert-butyl arsine (t-BuAsH$_2$) for passivating the silicon surface is the first demonstration that an organometallic source can be used to terminate a silicon surface with arsenic without carbon contamination of the surface which would lead to defects at the interface and degradation of the subsequent epilayer. The ability to use an all-metalorganic approach avoids the problems associated with carbon contamination of solid sources installed in otherwise metalorganic systems. Contamination of solid sources by carbonaceous deposits can change the characteristics of the solid source flux and composition in an uncontrollable and irreproducible way.

The inventors are not aware of any other method by which direct growth of II–VI materials on silicon by MOMBE has been demonstrated. In general, the MOMBE growth technique offers superior flux control without flux transients and without crucible depletion effects which are inherent in MBE. The rapid and reproducible flux control of MOMBE allows facile determination of growth kinetics and surface phase diagrams which are valuable tools in optimizing film quality.

The inventors have developed a method by which MOMBE growth on silicon can be achieved using t-BuAsH$_2$ to terminate the silicon surface with arsenic and have demonstrated the growth of crystalline ZnSe using this technique. t-BuAsH$_2$ is a compound which consists of arsenic bound to two hydrogens and a tertiary-butyl group ($-C(CH_3)_3$). Although the exact mechanism of decomposition is unknown, it is believed that the presence of the hydrogen ligands lead to efficient recombination of the tertiary-butyl radical with hydrogen to form a stable hydrocarbon which has less propensity to dissociatively adsorb on the silicon surface.

Other hydrocarbon radicals R, given by the formula $C_nH_{2n+1}$ or $C_nH_{2n-1}$, where n ranges from 1 to 6, may also be employed in the practice of the invention, so long as they form stable hydrocarbons during the decomposition of the metalorganic compound on the silicon surface. Preferably, n ranges from 2 to 6, and most preferably, is a sterically-hindered radical, such as t-butyl, isopropyl, neopentyl, and cyclohexyl. Other radicals also useful in the practice of the invention include ethyl, allyl, and vinyl.

As an example of the method of the invention, a silicon wafer is provided with a pre-cleaned, hydrogen-passivated surface. The pre-cleaning is accomplished using the well-known RCA cleaning procedure, which comprises first degreasing the silicon wafer and then exposing the silicon surface to an etchant comprising an aqueous solution of hydrogen peroxide and ammonium hydroxide. This pre-cleaning procedure improves the morphology of the final II–VI layer.

Hydrogen passivation of silicon surfaces is well-known in the art and is achieved by a dip in dilute aqueous HF solution, e.g., 4.5% HF. The pre-cleaned, hydrogen-passivated silicon wafer is then placed in the growth chamber.

The silicon wafer is outgassed for a time sufficient to desorb any hydrocarbons adsorbed on the silicon surface. Typically, the outgassing process is carried out at a temperature of about 150° C. for about 1 hour.

The metalorganic source cell (also known as the cracker cell) in the MOMBE apparatus may be heated to an elevated temperature of about 150° C. The temperature is selected to be high enough to prevent condensation of water vapor in the cell which is water-cooled but low enough to prevent dissociation of the metalorganic in the cell itself, as it is desired that the metalorganic be cracked on the silicon surface. The other cells of the MOMBE apparatus are also heated to a temperature of about 150° C. This keeps water from condensing on them and keeps the background pressure low. It will be appreciated that the temperature of 150° C. is not critical, and other elevated temperatures that accomplish the same purposes may be used.

The background pressure of the MOMBE apparatus is maintained at about $5 \times 10^{-9}$ to $1 \times 10^{-8}$ torr, and the cryopanels are cooled using liquid nitrogen.

The silicon wafer is exposed to the arsenic metalorganic compound. An upstream pressure of about 0.9 torr of the arsenic metalorganic compound is typically used, but this may range from about 0.1 to 10 Torr. This is done by flowing the gaseous compound through an orifice of about 0.5 mm, but which may range in size from about 0.3 to 4 mm. The growth chamber pressure is about $4 \times 10^{-7}$ Torr, but may range in pressure from about $10^{-8}$ to $10^{-4}$ Torr. The important parameter in the metalorganic As exposure is the ratio of the As beam to ambient background. The same ratio may be obtained with different combinations of orifice sizes and upstream pressures which will in turn affect the operating pressure. That is why the ranges given are so broad.

It is preferred that the ratio of metalorganic As beam pressure to background pressure be at least about 100:1. Lower ratios may be used; however, the driving consideration here is the relative sticking coefficient of arsenic compared with that of the background materials (such as hydrocarbons and water). A ratio of at least about 100:1 has been successfully used to ensure that the arsenic film deposited on the silicon surface is essentially arsenic, although a lower ratio may also be employed.

When the flux from the source material (arsenic metalorganic compound) is stable, the substrate temperature is increased to at least 500° C. This a consequence of prior HF dip used to prepare the silicon surface, which leaves the surface with a hydrogen-termination. This hydrogen does not begin to desorb from the silicon surface until about 500° C. At this temperature, the t-BuAsH$_2$ will also decompose on the surface. Prior to the adsorption of As, the (100) Si surface has a structure representative of a bulk termination i.e. (1×1) as determined by RHEED. Following As adsorption on the Si surface, the RHEED pattern changes to a double periodicity in a single [110] direction i.e. a (2×1) reconstruction of the surface occurs.

The RHEED pattern is monitored by measuring the intensity of diffracted electrons in the specular direction during the arsenic deposition. When the intensity no longer increases, the silicon surface is assumed to be passivated. This measured time interval is increased by a factor of about 3 to 6 during the exposure to ensure that passivation is complete.

It takes about 5 minutes to achieve a substantially constant intensity. Typically, the silicon surface is exposed for about 15 to 30 minutes, or about 3 to 6 times the minimum time required to passivate the surface. Once the surface is passivated, the arsenic metalorganic source is shuttered off from the system. The temperature of the As passivated silicon wafer is then lowered to the appropriate growth temperature for growth of the II-VI layer. The details of such II-VI growth are conventional and do not form a part of this invention.

As indicated above, the teachings of the invention can be incorporated in other metalorganic deposition processes, including MOVPE. Arsenic passivates the silicon surface and provides an improved growth layer for subsequent II-VI growth. This advantage appears to be due to the fact that arsenic is more ionic than silicon, which is covalent, and thus possesses an ionic nature that is more similar to that of the II-VI compound than does silicon.

The MOVPE process also begins with a silicon wafer which has a hydrogen-passivated surface obtained by a dip in dilute HF. Similarly, the hydrogen-passivated surface is placed in the MOVPE chamber and outgassed at a temperature of 150° C. for about 1 hour, but this is done in the presence of flowing molecular hydrogen with a flow rate which may span from 1 to 10 liter per minute (lpm). Following this outgassing procedure, the surface is exposed to flowing t-BuAsH$_2$ at a flow rate which will allow the ratio of the t-BuAsH$_2$ pressure to background to be as high as practically possible for the apparatus. This value may be adjusted to allow a steady state t-BuAsH$_2$ partial pressure of 10 to 100 Torr. During the t-BuAsH$_2$ exposure, the temperature of the silicon wafer is raised to at least 500° C. and held there for the same length of time as in the MOMBE case, i.e., 15 to 30 minutes. At the end of this time, the surface is assumed passivated and the normal procedure for II-VI epilayer growth can be performed.

EXAMPLES

Example 1:

In this Example, arsenic passivation in a MOMBE apparatus is described. While in this Example the orientation of the silicon substrate was (001), other orientations, such as (110) and (111), may also be employed in the practice of the invention.

Two-inch silicon substrates, either exactly oriented (001) or oriented (100) and miscut either 4° or 8° toward the nearest <111> plane, were prepared by dipping in approximately 4% aqueous HF for approximately 15 seconds in accordance with the method described by B.S. Meyerson et al, *Applied Physics Letters*, Vol. 57, pp. 1034-1036 (1990). The substrates were mounted on 2-inch molybdenum holders designed for radiative heating and transferred into vacuum within 15 minutes. X-ray photoelectron spectroscopy (XPS) analysis of the silicon surfaces treated in this way indicated that the silicon surface was free of carbon and oxygen contamination as shown in FIG. 1.

Figure 2A:
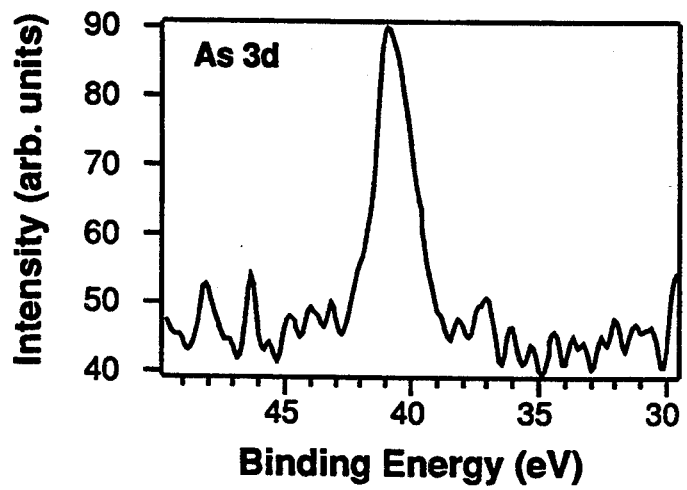
FIGS. 2a and 2b, on coordinates of intensity (in arbitrary units) and binding energy (in eV), are high resolution XPS spectra taken in Fixed Analyzer Transmission (FAT) mode with a pass energy of 25 eV, with Al Kα excitation (15 KV, 20 ma) of As 3d electrons (FIG. 2a) and C is electrons (FIG. 2b) regions following exposure of a silicon substrate to t-butylarsine during temperature ramp of the substrate.
Figure 2B:
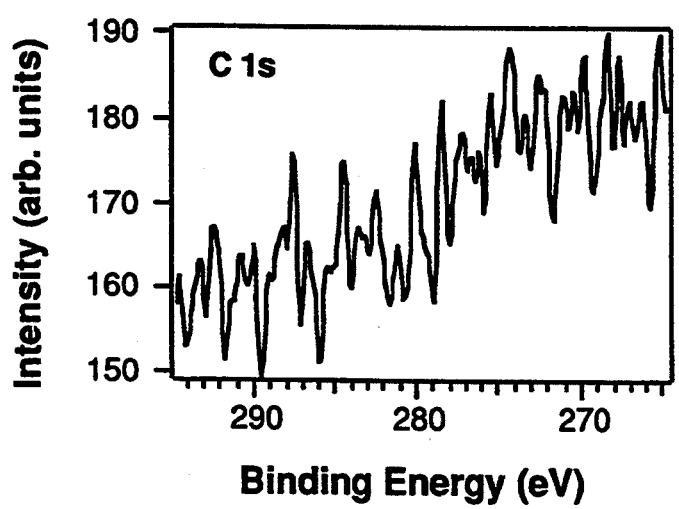

The substrate was then transferred into the MOMBE chamber in which all gas source cell crackers were maintained at an indicated temperature of 200° C. and the cryopanel was cold (liquid N$_2$ temperature). It is important to note that the cells are always maintained at this temperature when they are not in use to prevent residual water adsorption. The reflection high energy electron diffraction (RHEED) pattern of the silicon substrate as transferred was streaked in a (1×1) pattern with no visible reconstruction. The flow of t-BuAsH$_2$ (Air Products, electronic grade), estimated to be on the order of 1 sccm, was initiated prior to heating of the silicon substrate. After initiation of the t-BuAsH$_2$ flux, the temperature of the silicon substrate was increased while the RHEED specular intensity was monitored. At a substrate temperature of approximately 450° C., the specular intensity began to increase dramatically. The silicon substrate was then held at 500° C. for 15 minutes, after which a strong (2×1) reconstruction could be clearly observed by RHEED. At this exposure temperature, excess As desorbs from the surface, and the adsorption is self-limiting at one monolayer of As coverage. XPS analysis of the silicon surface following this treatment revealed the presence of arsenic on the surface but no detectable carbon, as shown in FIG. 2.

Figure 3:
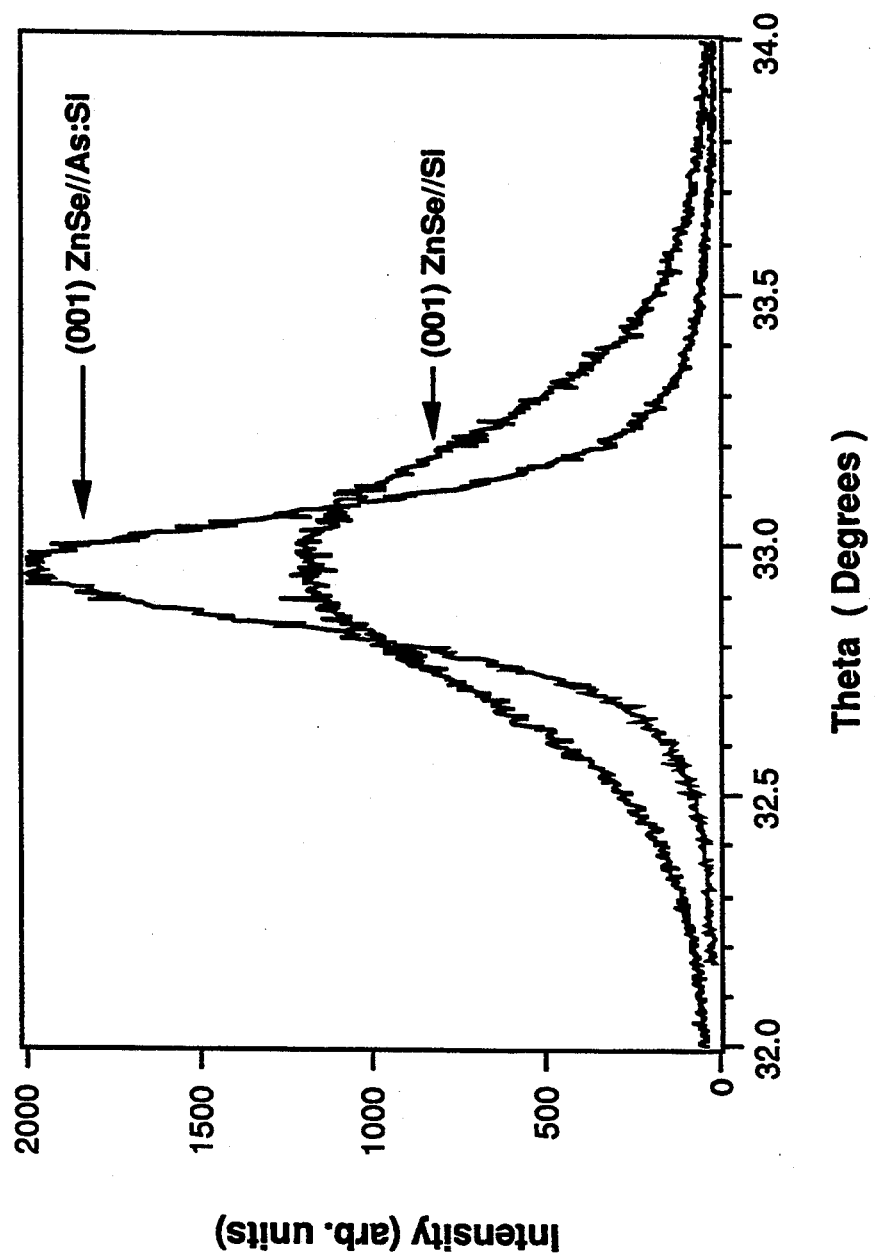
FIG. 3 on coordinates of intensity (in arbitrary units) and theta angle (in degrees), is a plot of double crystal X-ray rocking curves for (001) ZnSe films grown on silicon with and without arsenic passivation from t-butylarsine.

Growth of ZnSe was initiated on the arsenic-terminated silicon surface after stabilizing the substrate temperature at 380° C. The source materials used for ZnSe growth were diethylzinc (DEZn) and diethylselenium (DESe), which were thermally pre-cracked at 800° C. and 900° C., respectively. The cracker cells were raised to their operating temperatures only after arsenic termination of the silicon surface was complete. X-ray rocking curve measurements for an approximately 3 μm ZnSe film grown on (001) As:Si as described above and a ZnSe film grown on (001) Si without arsenic termination are displayed in FIG. 3. These films were grown using the same temperature and flux conditions (380° C., 2.0 Torr DESe, 1.25 Torr DEZn), but the growth times for ZnSe//As:Si versus ZnSe//Si were 6 and 12 hours, respectively, with nominally similar growth rates. Despite the shorter growth time and consequently thinner epilayer, the ZnSe//As:Si had significantly superior crystalline quality, confirming the successful As termination of the Si(001) surface using t-BuAsH$_2$.

Example 2:

In this Example, arsenic passivation in a MOVPE apparatus is described.

Silicon substrates, oriented (001), are prepared by dipping in approximately 4% aqueous HF for approximately 15 seconds in accordance with the method described by B.S. Meyerson et al, *Applied Physics Letters*, Vol. 57, pp. 1034–1036 (1990). The substrates are mounted on molybdenum holders designed for conductive heating and transferred into vacuum within 15 minutes.

The substrate is then transferred into the MOVPE chamber. The hydrogen passivated surface is outgassed at a temperature of 150° C. for about 1 hour in the presence of flowing molecular hydrogen with a flow rate which may span from 1 to 10 lpm. Following this outgassing procedure, the surface is exposed to flowing t-BuAsH$_2$ at a flow rate which allows the ratio of the t-BuAsH$_2$ pressure to background to be as high as practically possible for the apparatus. This value is adjusted to allow a steady state t-BuAsH$_2$ partial pressure of 10 to 100 Torr. During the t-BuAsH$_2$ exposure, the temperature of the silicon wafer is raised to at least 500° C. and held there for 5 to 30 minutes. At the end of this time, the surface is assumed passivated and the normal procedure for II–VI epilayer growth is commenced.

Thus, there has been disclosed a method for passivating silicon surfaces with arsenic for the subsequent growth of II–VI layers thereon. It will be readily apparent to those skilled in this art that various changes and modifications of an obvious nature may be made, and all such changes and modifications are considered to fall within the scope of the invention, as defined by the appended claims.

What is claimed is:

1. A method of passivating a surface of a silicon substrate with an arsenic film, comprising:
   (a) placing said silicon substrate in a vacuum growth chamber adapted for growth of films from metalorganic compounds and having a ratio of compound pressure to background pressure of at least 100:1; and
   (b) exposing said silicon substrate to vapors from an arsenic metalorganic compound having the formula $R_{3-m}AsH_m$, where R is an organic radical selected from the group consisting of $C_nH_{2n+1}$ and $C_nH_{2n-1}$, where n ranges from 1 to 6, and where m is 1 or 2, for a period of time to ensure passivation of said surface by the deposition of a monolayer of arsenic thereon.

2. The method of claim 1 wherein n ranges from 2 to 6.

3. The method of claim 1 wherein said metalorganic compound is selected from the group consisting of tert-butyl arsine, isopropyl arsine, ethyl arsine, neopentyl arsine, cyclohexyl arsine, allyl arsine, and vinyl arsine.

4. The method of claim 1 wherein said vacuum growth chamber is part of a metalorganic molecular beam epitaxy apparatus.

5. The method of claim 4 wherein said silicon substrate is heated to a temperature of at least 500° C.

6. The method of claim 5 wherein said period of time to ensure passivation of said silicon surface is about 15 to 30 minutes.

7. The method of claim 4 wherein said silicon surface is analyzed by reflection high energy electron diffraction during growth of said arsenic film, said reflection high energy electron diffraction generating a signal having an intensity that is monitored until it ceases to increase.

8. The method of claim 7 wherein said growth of said arsenic film is continued for a period of time after said intensity ceases to increase, at which point growth of said arsenic film is terminated.

9. The method of claim 1 wherein said vacuum growth chamber is part of a metalorganic vapor phase epitaxy deposition apparatus.

10. A method of growing a layer of a II–VI semiconductor compound on a surface of a silicon substrate, comprising:
    (a) placing said silicon substrate in a vacuum growth chamber adapted for growth of films from metalorganic compounds and having a ratio of compound pressure to background pressure of at least 100:1; and
    (b) exposing said silicon substrate to vapors from an arsenic metalorganic compound having the formula $R_{3-m}AsH_m$, where R is an organic radical selected from the group consisting of $C_nH_{2n+1}$ and $C_nH_{2n-1}$, where n ranges from 1 to 6, and where m is 1 or 2, for a period of time to ensure passivation of said surface by the deposition of a monolayer of arsenic thereon; and
    (c) growing said II–VI semiconductor film on said arsenic-passivated surface.

11. The method of claim 10 wherein n ranges from 2 to 6.

12. The method of claim 10 wherein said metalorganic compound is selected from the group consisting of tert-butyl arsine, isopropyl arsine, ethyl arsine, neopentyl arsine, cyclohexyl arsine, allyl arsine, and vinyl arsine.

13. The method of claim 10 wherein said vacuum growth chamber is part of a metalorganic molecular beam epitaxy apparatus.

14. The method of claim 13 wherein said silicon substrate is heated to a temperature of at least 500° C.

15. The method of claim 14 wherein said period of time to ensure passivation of said silicon surface is about to 30 minutes.

16. The method of claim 13 wherein said silicon surface is analyzed by reflection high energy electron diffraction during growth of said arsenic film, said reflection high energy electron diffraction generating a signal having an intensity that is monitored until it ceases to increase.

17. The method of claim 16 wherein said growth of said arsenic film is continued for a period of time after said intensity ceases to increase, at which point growth of said arsenic film is terminated.

18. The method of claim 10 wherein said vacuum growth chamber is part of a metalorganic vapor phase epitaxy deposition apparatus.

* * * * *